(12) United States Patent
Onishi et al.

(10) Patent No.: US 9,447,933 B2
(45) Date of Patent: Sep. 20, 2016

(54) VISIBLE LIGHT COMMUNICATION SYSTEM

(71) Applicant: Panasonic Intellectual Property Management Co., Ltd., Osaka (JP)

(72) Inventors: Toshikazu Onishi, Tokyo (JP); Kazuhiko Yamanaka, Osaka (JP); Takuma Katayama, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/598,030

(22) Filed: Jan. 15, 2015

(65) Prior Publication Data

US 2015/0124433 A1 May 7, 2015

Related U.S. Application Data

(63) Continuation of application No. PCT/JP2013/001957, filed on Mar. 22, 2013.

(30) Foreign Application Priority Data

Jul. 18, 2012 (JP) ................................ 2012-159225

(51) Int. Cl.
*F21K 99/00* (2016.01)
*H04B 10/116* (2013.01)
(Continued)

(52) U.S. Cl.
CPC .................. *F21K 9/56* (2013.01); *B82Y 20/00* (2013.01); *F21V 13/02* (2013.01); *H04B 10/116* (2013.01); *H01S 5/0078* (2013.01); *H01S 5/0216* (2013.01);
(Continued)

(58) Field of Classification Search
CPC ......... F21K 9/56; B82Y 20/00; F21V 13/02; H04B 10/116
See application file for complete search history.

(56) References Cited

U.S. PATENT DOCUMENTS

| | | | |
|---|---|---|---|
| 2004/0247323 A1 | 12/2004 | Morioka et al. | |
| 2008/0151952 A1* | 6/2008 | Takatani | B82Y 20/00 372/36 |
| 2008/0240196 A1* | 10/2008 | Nishida | H01S 5/423 372/50.12 |

FOREIGN PATENT DOCUMENTS

| | | |
|---|---|---|
| JP | 2002-289969 A | 10/2002 |
| JP | 2003-318836 A | 11/2003 |

(Continued)

OTHER PUBLICATIONS

Onishi, T., et al.: "Polarization Control of VCSEL Array Utilizing Surface Plasmon Resonance", IEICE Technical Report Laser-Ryoshi Electronics, Dec. 1, 2006, vol. 106, No. 404, pp. 17-20, with English abstract.

(Continued)

*Primary Examiner* — Mary Ellen Bowman
(74) *Attorney, Agent, or Firm* — McDermott Will & Emery LLP

(57) ABSTRACT

A visible light communication system includes a light transmitter including a group III nitride semiconductor laser element and a wavelength converter provided to face a light exit surface of the nitride semiconductor laser element and containing a fluorescent material. The visible light communication system further includes a wavelength filter configured to remove light emitted from the fluorescent material and a light receiving element configured to receive light emitted from the group III nitride semiconductor laser element via the wavelength filter.

12 Claims, 8 Drawing Sheets

(51) Int. Cl.

| | | |
|---|---|---|
| *B82Y 20/00* | (2011.01) | |
| *F21V 13/02* | (2006.01) | |
| *H01S 5/02* | (2006.01) | |
| *H01S 5/042* | (2006.01) | |
| *H01S 5/183* | (2006.01) | |
| *H01S 5/343* | (2006.01) | |
| *H01S 5/42* | (2006.01) | |
| *H01S 5/00* | (2006.01) | |

(52) U.S. Cl.
CPC .......... *H01S 5/0425* (2013.01); *H01S 5/18369* (2013.01); *H01S 5/34333* (2013.01); *H01S 5/423* (2013.01)

(56) References Cited

FOREIGN PATENT DOCUMENTS

| JP | 2004-363756 A | 12/2004 |
| JP | 2007-266484 A | 10/2007 |
| JP | 2008-277780 A | 11/2008 |
| JP | 2011-054717 A | 3/2011 |
| JP | 2012-049292 A | 3/2012 |

OTHER PUBLICATIONS

International Search Report issued in PCT/JP2013/001957, dated May 28, 2013, with English translation.

* cited by examiner

POLARIZATION DIRECTION OF OUTPUT LIGHT (RANDOM POLARIZATION)

CRYSTAL AXIS OF NITRIDE SEMICONDUCTOR LAYERS

POLARIZATION DIRECTION OF OUTPUT LIGHT (LINEAR POLARIZATION)

CRYSTAL AXIS OF NITRIDE SEMICONDUCTOR LAYERS

POLARIZATION DIRECTION OF
OUTPUT LIGHT
(LINEAR POLARIZATION)

VISIBLE LIGHT COMMUNICATION SYSTEM

CROSS-REFERENCE TO RELATED APPLICATIONS

This is a continuation of International Application No. PCT/JP2013/001957 filed on Mar. 22, 2013, which claims priority to Japanese Patent Application No. 2012-159225 filed on Jul. 18, 2012. The entire disclosures of these applications are incorporated by reference herein.

BACKGROUND

Visible light communication technology using visible light recognizable by human eyes to perform wireless communication has received attention. Light-emitting devices configured to emit visible light are found in various forms including lighting apparatuses installed in houses, in offices, or on roads, displays, electronic devices, traffic lights, and display apparatuses such as electronic bulletins everywhere in daily life. Only providing a communication function to apparatuses including such light-emitting devices can easily create a wireless communication environment.

In particular, in conventional wireless communication of mobile phones, wireless LANs, and the like, transmission power cannot be increased generally due to the influence of electromagnetic waves on human body. In contrast, in visible light communication, an electric power as high as several watts used for illumination can be utilized as it is for transmission. By taking advantage of such a feature, effective use of the visible light communication is expected in locations where wireless communication has not been available.

For example, the wireless communication using electromagnetic waves may not be used in hospitals, airplanes, and the like due to the influence of the electromagnetic waves on precision instruments. However, when visible light is used, the wireless communication can be used without influencing electronic devices. Moreover, light-emitting diodes (LEDs) which have become widely available for general illuminating apparatuses and display apparatuses can be turned on and off at a higher speed than conventional incandescent lamps, fluorescent lamps, etc. Thus, high-speed data transmission is possible by utilizing the LEDs. As described above, the visible light communication has features such as being ubiquitous, having high safety and high speed. Therefore, expectations for the visible light communication are growing to serve as a novel communication system.

As a visible light communication system, Japanese Unexamined Patent Publication No. 2003-318836 (hereinafter referred to as Patent Document 1), for example, shows a system including an illumination light transmitter configured to transmit a signal by using illumination light of a white LED and an illumination light receiver configured to receive the signal. Specifically, an illumination light transmitter includes a white LED made of a blue LED and a fluorescent material, an illumination light receiver includes a light receiving element and a blue filter configured to block light emitted from the fluorescent material and having a low response speed, and the illumination light transmitter and the illumination light receiver are used so that only direct light from the blue LED is used for optical communication. This can increase the speed of the communication.

SUMMARY

However, the conventional visible light communication system described in Patent Document 1 has two problems where the intensity of the received light signal has to be increased and where the communication speed has to be increased.

First, the intensity of a received light signal has a problem resulting from the use of the visible light communication system in an environment where strong light from outside, for example, sunlight or light from other illuminating devices exists. In the conventional visible light communication system, only blue light is received by the light receiving element. In contrast, if sunlight, a white LED light source, or the like which is not used in the visible light communication system exists, blue light emitted from the sunlight, the white LED light source, or the like is received as a background by the light receiving element. Thus, in the environment in which the intensity of such light from outside is strong, it is no longer possible to extract a signal component from the received light.

Moreover, in order to increase the communication speed, light emitted from the fluorescent material and having a low response speed is blocked. However, the modulation speed itself of the LED is limited, and thus transmission and reception of large-capacity data is difficult. The modulation speed of the LED is limited by a relaxation oscillation frequency. The relaxation oscillation frequency depends primarily on the volume of an active layer of the LED. In a white LED used as general solid-state illumination, a backlight of a display, or the like and having a light-emitting unit whose area is 100 µm-1 mm square, the working speed of the while LED is limited to about several 100 MHz. The area of the light-emitting unit is reduced, and a mode volume is reduced, so that an improvement of the relaxation oscillation frequency can be expected. However, the intensity of emitted light is reduced at the same time. Therefore, luminous energy required for illumination can no longer be obtained.

Therefore, in the conventional white LED, the intensity of emitted light and the working speed are in a trade-off relationship, and thus it is difficult to obtain a high working speed exceeding, for example, 1 Gbps with the luminous energy necessary for illumination being maintained.

To solve the problems, a visible light communication system of the present disclosure includes: a light transmitter including a group III nitride semiconductor laser element and a wavelength converter disposed to face a light exit surface of the group III nitride semiconductor laser element and containing a fluorescent material; a wavelength filter configured to remove light emitted from the fluorescent material; and a light receiving element configured to receive light emitted from the group III nitride semiconductor laser element via the wavelength filter.

With this configuration, the wavelength width of light transmitted and received respectively by the light transmitter and the light receiver can be reduced, so that a visible light communication system less influenced by light from outside can be provided.

The group III nitride semiconductor laser element may be a surface emission laser array element including a plurality of group III nitride semiconductor surface emission lasers.

With this configuration, a surface emission laser array element can be used as a light source of the light transmitter of the visible light communication system. The diameter of a light-emitting unit of the surface emission laser is on the order of about several µm to several 10 µm, and thus the surface emission laser is an element whose active layer has a very small volume. Therefore, working speed exceeding, for example, 1 Gbps can be realized. The surface emission laser array element includes a plurality of surface emission laser elements having a low light output of for example, several mW and arranged in a two-dimensional array. With this configuration, luminous energy substantially equal to the luminous energy of an LED can be obtained without changing the chip area at the same time as the total area of the light-emitting unit can be reduced. Thus, a light source having high luminance and allowing high-speed modulation operation can be used as a light source of a light transmitter to provide a visible light communication system.

A stacking direction of nitride semiconductor multilayer films included in each group III nitride semiconductor surface emission laser may be a direction of a crystal axis inclined from a c-axis.

The crystal axis may be an m-axis.

With this configuration, light output from the group III nitride surface emission laser can be linearly polarized light polarized in one polarization direction. In this way, noise caused by polarization switching can be reduced in the group III nitride surface emission laser used as a light source of the light transmitter of the visible light communication system. Thus, preferable optical communication can be achieved even when light from outside is superimposed on the background to reduce the amplitude of the reception light signal in the light receiver.

Each group III nitride semiconductor surface emission laser may have a light outgoing section provided with a metal thin film in which micro openings are formed and arranged in a rectangular lattice.

With this configuration, anisotropy arises in light transmittance of the metal thin film, so that polarization is controlled to be in a polarization direction in which transmittance optimal for oscillation of a surface emission laser can be obtained.

Each group III nitride semiconductor surface emission laser may have a light outgoing section provided with a light diffusing element.

The light diffusing element may be a convex lens.

With this configuration, the emission angle of light output from the surface emission laser is increased, so that variations in spectrum which are caused depending on the output direction of light output from the light transmitter. As a result, location dependency of the communication sensitivity of the light receiver in the visible light communication system is reduced, so that preferable optical communication can be achieved.

A resin layer having a lower dielectric constant than a group III nitride semiconductor may be formed between the group III nitride semiconductor surface emission lasers.

With this configuration, parasitic capacitance caused by the interconnect electrode is reduced, so that the speed of the light transmitter can be increased. Therefore, the communication speed of the visible light communication system can be increased.

As described above, with the visible light communication system of the present disclosure, it is possible to achieve super high speed data communication with high precision even in an environment in which strong light from outside exists.

DETAILED DESCRIPTION

Embodiments of the present disclosure will be described below with reference to the drawings.

First Embodiment

Figure 1:
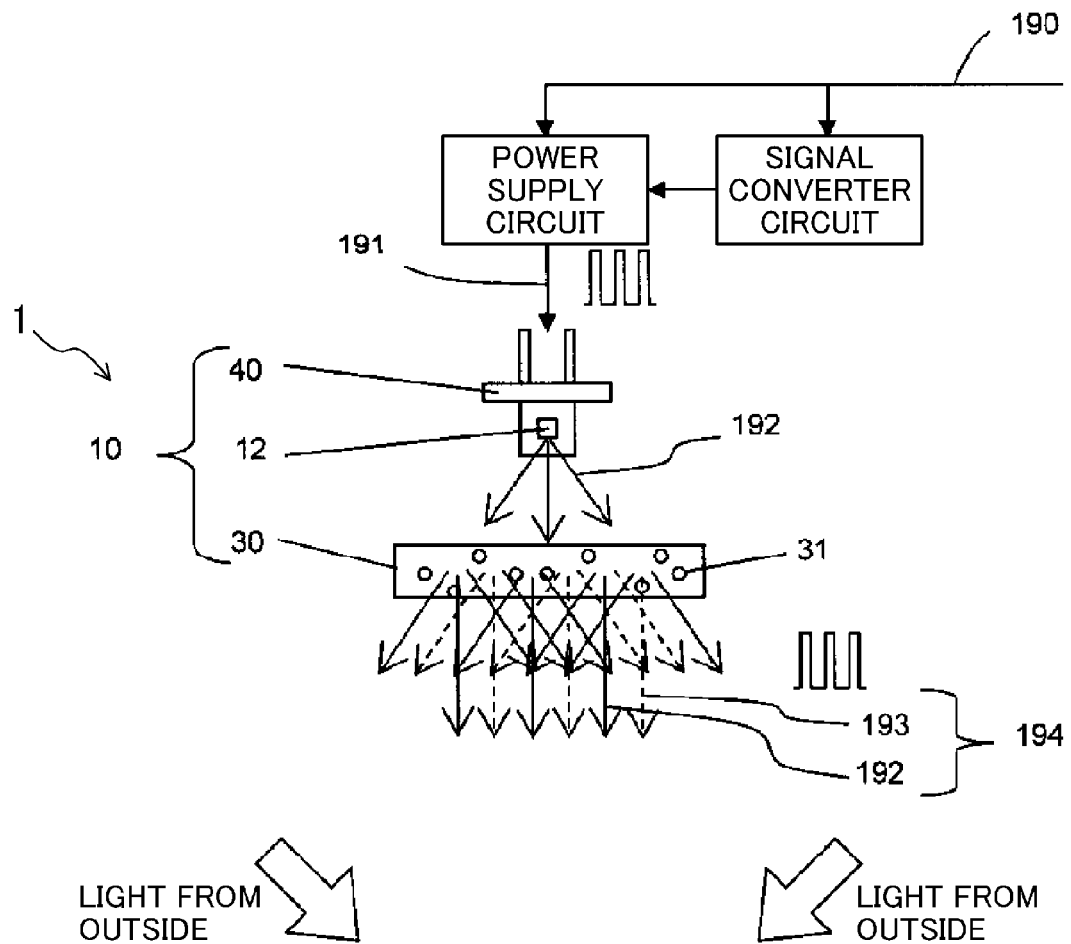
FIG. 1 is a view illustrating a configuration of a visible light communication system of a first embodiment of the present disclosure.
Figure 1:
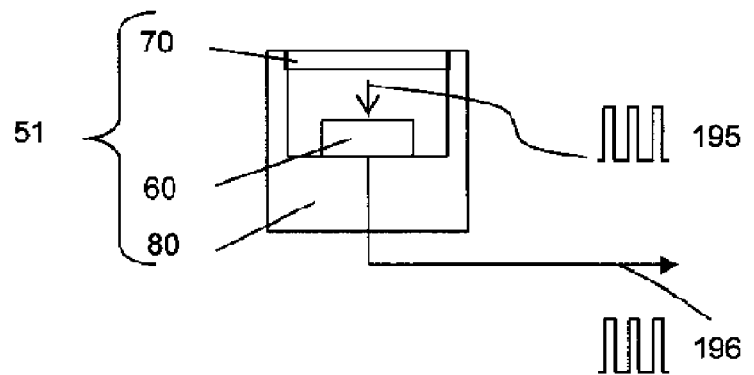

FIG. 1 is a view illustrating a configuration of a visible light communication system according to a first embodiment of the present disclosure. FIGS. 2A, 2B, 3, and 4 are views illustrating the effect of the visible light communication system according to the present embodiment.

A light transmitter 10 illustrated in FIG. 1 and used in a visible light communication system 1 includes a semiconductor laser element 12, a package 40, and a wavelength converter 30. The semiconductor laser element 12 is configured to emit a laser beam having a wavelength corresponding to, for example, blue light. The package 40 is configured to hold the semiconductor laser element 12. The wavelength converter 30 faces a light output surface of the semiconductor laser element 12.

A light receiver 51 includes a light receiving element 60, an optical filter 70, and a package 80. The light receiving element 60 is configured to receive the light emitted from the semiconductor laser element 12. The optical filter 70 is a sharp-cut filter provided above a light receiving surface of the light receiving element 60 and configured to transmit only light having a wavelength in a very narrow range, for example, a wavelength from 440 nm to 450 nm therethrough. The package 80 is configured to hold the light receiving element 60 and the optical filter 70. The semiconductor laser element 12 is made of a group III nitride semiconductor and is configured to oscillate a laser beam having a peak wavelength in the blue wavelength range from 440 nm to 450 nm by current injection.

The wavelength converter 30 is made of, for example, a transparent base material such as silicone or low-melting point glass containing a fluorescent material 31. The fluorescent material 31 is, for example, cesium-activated yttrium-aluminum-garnet (YAG:Ce), a mixture of europium-activated SiAlON (SiAlON:Eu) and europium-activated (Sr, Ca)AlSiN$_3$ crystals, or the like. The wavelength converter 30 absorbs part of the laser beam, which is in the blue wavelength range and has been emitted from the semiconductor laser element 12, and outputs fluorescence having a wavelength from 490 nm to 660 nm in the green to red wavelength range.

Subsequently, operation of the visible light communication system 1 of the present embodiment will be described.

First, a power supply circuit generates a transmission electric signal 191 which is a predetermined direct current from electric power 190 which is, for example, an alternating current of 100 V externally applied from, for example, an outlet. The transmission electric signal 191 is applied to the semiconductor laser element 12 of the light transmitter 10. The semiconductor laser element 12 converts the transmission electric signal 191 to a transmission light signal 192 which is blue light and outputs the blue light.

Part of the transmission light signal 192 which is the blue light output from the semiconductor laser element 12 is absorbed by the fluorescent material 31 in the wavelength converter 30 and is output as fluorescence 193 which is green to red light. The light transmitter 10 outputs light having a white color as a transmission light signal 194, the white color being obtained by mixing the fluorescence 193 and part of the transmission light signal 192 which is not absorbed by the wavelength converter 30.

Here, a direct current exceeding the threshold current of a laser is applied to the light transmitter 10 in a stationary state by the power supply circuit, so that the white light is output. In this way, the light transmitter 10 serves as a white illumination apparatus.

On the other hand, when the light transmitter 10 is operated as a communication device, a signal converter circuit including a modulator, and the like converts transmission data superimposed on the electric power 190 to an electrical signal having a predetermined pulse width. Moreover, a transmission electric signal 191 in which the electrical signal has been superimposed on a direct current is generated by the power supply circuit and is input to the semiconductor laser element 12.

The transmission electric signal 191 is converted by the semiconductor laser element 12 into a light signal, and the light signal is output as a transmission light signal 192 which is blue light. Part of the output transmission light signal 192 is absorbed by the wavelength converter 30, but the remaining part of the output transmission light signal 192 is output from the light transmitter 10 as a transmission light signal 192 which is blue light obtained by the superimposition of the electrical signal. The part of the transmission light signal 192 absorbed by the wavelength converter 30 becomes pulsed green to red fluorescence 193, which is output from the light transmitter 10. Therefore, the light transmitter 10 outputs a transmission light signal 194 whose color is obtained by mixing the color of the transmission light signal 192 and the color of the fluorescence 193.

Here, the transmission light signal 194 is a light signal whose pulse width and period are sufficiently shorter than one millisecond. Therefore, the transmission light signal 194 is recognized as white continuous light by human eyes and serves as white illumination similar to the case where no transmission data is applied.

The signal transmitted from the light transmitter 10 is received by the light receiver 51 mounted to, for example, a mobile device. The transmission light signal 194, which is white illumination light output from the light transmitter 10, is received by the light receiving element 60 through the optical filter 70. Here, a reception light signal 195 which is blue light obtained by superimposition of the pulsed modulation signal enters the light receiving element 60. The light receiving element 60 converts the reception light signal 195 to a pulsed reception electrical signal 196. After a direct-current component is removed from the pulsed electrical signal, the pulsed electrical signal is detected as reception data by a demodulator, or the like.

In the present embodiment, the semiconductor laser element 12 is used as an element for converting the transmission electric signal 191 to the transmission light signal 192. A light-emitting unit of the semiconductor laser element 12 has a width of about several μm to several 10 μm and a length of about several 100 μm to several mm, so that the volume of an active layer contributing to light emission is very small. Since induced emission light is generated in the light-emitting unit to emit light, the spectral width of the emitted light is small. Thus, the semiconductor laser element 12 is an element which outputs high-power light from the light-emitting unit having a small area. The effect obtained by mounting such an element to the light transmitter 10 will be described with reference to computation results shown in FIGS. 2A, 2B, 3, and 4.

Figure 2A:
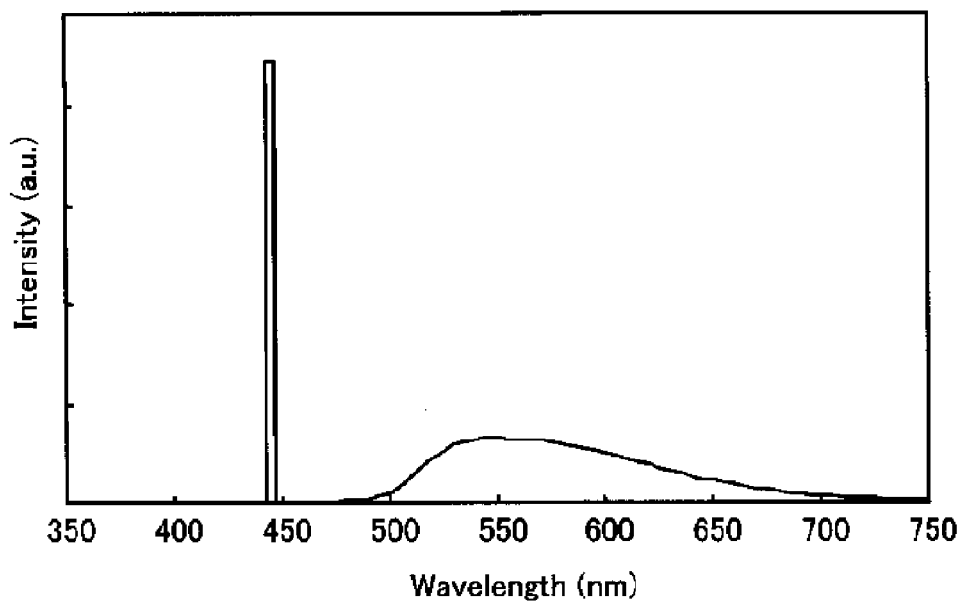
FIG. 2A is a view illustrating an emission spectrum of a light transmitter of the first embodiment of the present disclosure.
Figure 2B:
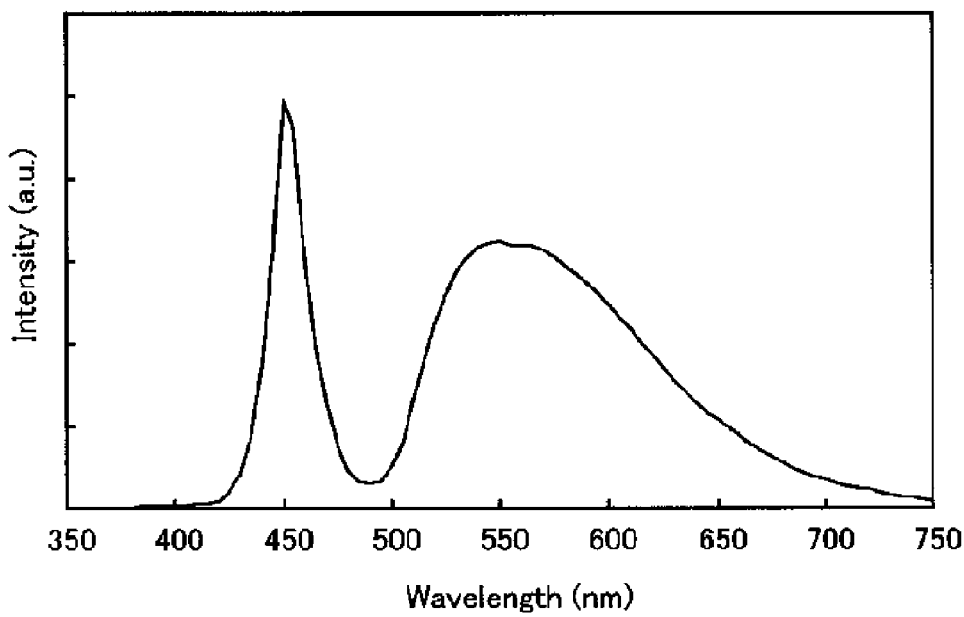
FIG. 2B is a view illustrating an emission spectrum of a conventional light transmitter.
Figure 3:
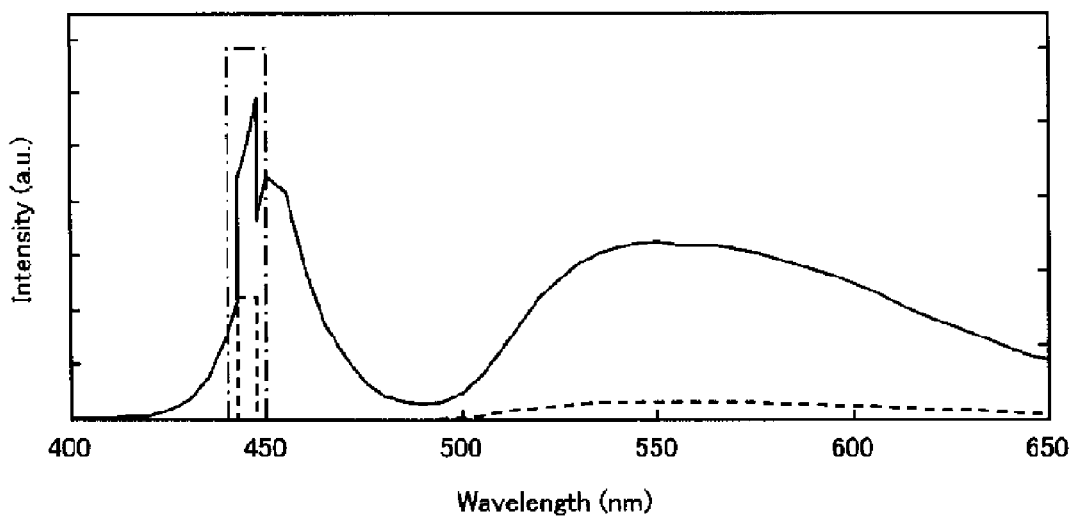
FIG. 3 is a view illustrating the emission spectrum of light received by a light receiver of the first embodiment of the present disclosure and the transmittance of an optical filter.
Figure 4:
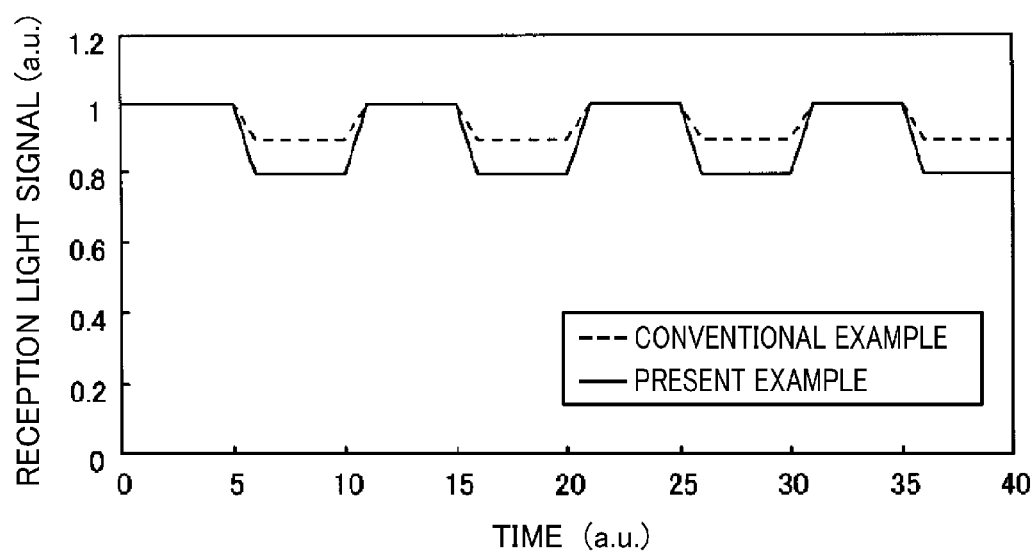
FIG. 4 is a view illustrating comparison of light signals received by the light receiver of the first embodiment of the present disclosure and a conventional light receiver.

FIG. 2A is a view illustrating an emission spectrum of the light transmitter 10 including the semiconductor laser element 12 of the present embodiment. FIG. 2B is a view illustrating an emission spectrum of a conventional light transmitter including a white LED. FIG. 3 is a view illustrating the emission spectrum of light received by the light receiver 51 of the visible light communication system 1 of the present embodiment and the transmittance of the optical filter. FIG. 4 is a view illustrating comparison of reception light signal between an example of the present embodiment and a light receiver 51 of a conventional visible light communication system. Note that "a.u." of the vertical axis means an arbitrary unit.

First, FIG. 2A shows the spectrum of the transmission light signal 194 in the case where in the light transmitter 10 of the present embodiment, the center wavelength of light output from the semiconductor laser element 12 is 445 nm and YAG:Ce is used as the fluorescent material 31 of the wavelength converter 30. Here, the computation was performed assuming that the width of the spectrum of the light output from the semiconductor laser element 12 is 5 nm for simplification. The color temperature of the transmission light signal was assumed to be about 5000 K (chromaticity coordinate (0.346, 0.363)).

FIG. 2B shows the spectrum of the transmission light signal of the conventional light transmitter. The color temperature of the transmission light signal was assumed to be about 5000 K (chromaticity coordinate (0.345, 0.372)) which is similar to that of the light transmitter 10.

In the present embodiment, the semiconductor laser is used as an element for emitting light in the blue wavelength range, which results in a spectrum having a narrow spectral width in the blue wavelength range and having a high peak intensity. Various types of light from outside as described above are superimposed on the light from the light transmitter, and the light on which the light from outside has been superimposed enters the light receiver. In FIG. 3, the solid line shows the spectrum of light entering the optical filter of the light receiver 51 in the case where light of a general illumination apparatus using a white LED is superimposed as a background on light of a light-emitting device to increase the intensity by a factor of nine. (Here, light output from the light transmitter 10 is indicated by the broken line). The transmittance of the optical filter configured to extract only light in the blue range is indicated by the dash-dot line.

Here, in the case of the conventional visible light communication system, the light-emitting element of the light transmitter is the white LED and has an emission spectrum identical with that of light at the background. Since general illumination light having a spectrum identical with that of the light-emitting element of the light transmitter enters the light receiver, light which is received by the light receiver and is in the blue range is light on which the general illumination light has been superimposed by a factor of nine.

On the other hand, in the case of the visible light communication system of the present embodiment, the spectrum of light from the light transmitter 10 is narrower than the spectrum of the general illumination light as described above. Therefore, when an optical filter which transmits light having a narrow wavelength therethrough is used, the reception light signal can be extracted at a high ratio from the light which is in the blue range and is obtained by superimposition of the general illumination light. Specifically, when the optical filter shown in FIG. 3 is used, the amplitude of the reception light signal 195 of the present embodiment is about two times as high as the amplitude of the conventional reception light signal as illustrated in FIG. 4. With this configuration, it is possible to achieve optical communication with reduced influence of light from outside, which is difficult in the visible light communication system using a conventional white LED. Since the visible light communication system of the present embodiment includes a semiconductor laser element, modulation can be performed at a speed in the range from several 100 Mpbs to 1 Gbps or a speed exceeding 1 Gbps to generate a transmission signal.

Note that the visible light communication system 1 of the present embodiment includes the semiconductor laser element 12 as a light-emitting element. Since the semiconductor laser element 12 has a smaller divergence angle of light emission than LEDs, the present system is applicable to visible light communication using illumination apparatuses such as spotlights having high directivity.

Moreover, in the visible light communication system 1 of the present embodiment, a light diffusing element configured to diffuse light may be provided between the semiconductor laser element 12 of the light transmitter 10 and the wavelength converter 30, and the wavelength converter may be uniformly irradiated with light output from the semiconductor laser element.

In the visible light communication system 1 of the present embodiment, the peak wavelength of the light output from the semiconductor laser element 12 is in the blue wavelength range from 440 nm to 450 nm, and the optical filter is a sharp-cut filter configured to transmit only light having a wavelength from 440 nm to 450 nm therethrough. However, the semiconductor laser element 12 and the optical filter are not limited to these configurations. In order to obtain a preferable color temperature, the wavelength of the output light and/or the transmission wavelength of the optical filter can be changed. In this case, it is preferable that the peak wavelength of the light output from the semiconductor laser element be from 400 nm to 500 nm, and the transmission wavelength range of the sharp-cut filter allow transmission of the output light and be smaller than the spectral width of a blue LED. The optical filter is preferably designed in taking account of a temperature shift of the wavelength of the light output from the semiconductor laser element 12.

Second Embodiment

Next, a second embodiment of the present disclosure will be described.

Figure 5:
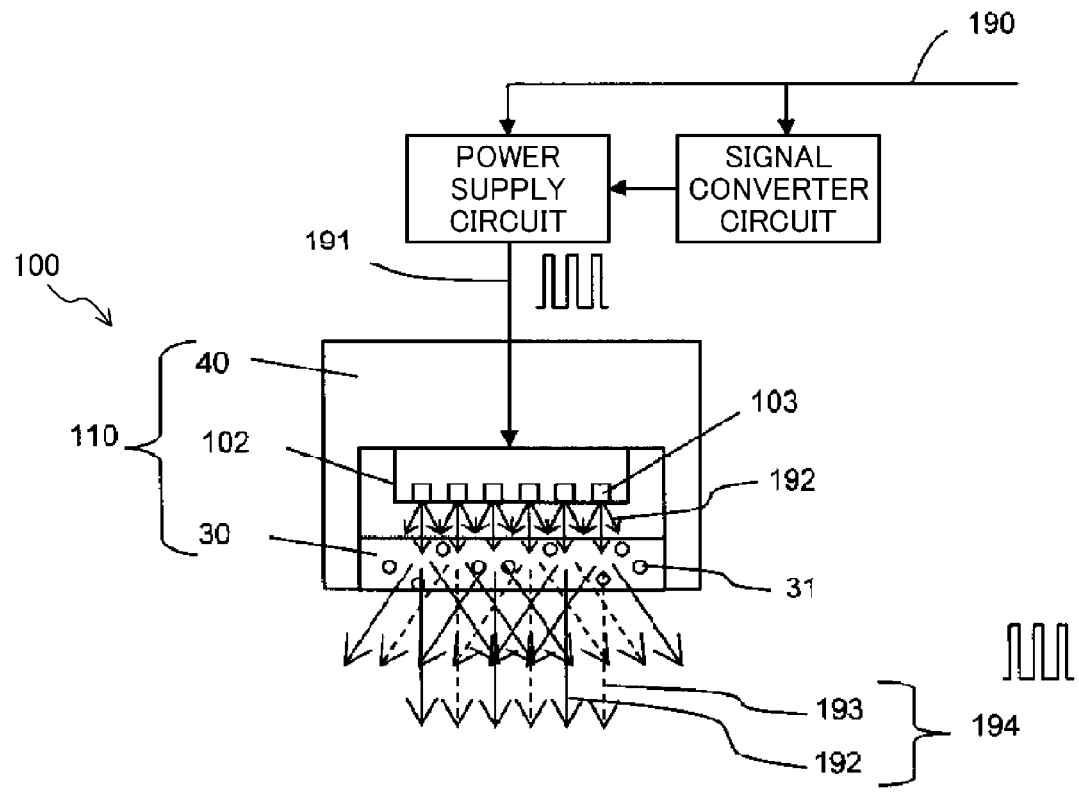
FIG. 5 is a view illustrating a configuration of a visible light communication system of a second embodiment of the present disclosure.
Figure 5:
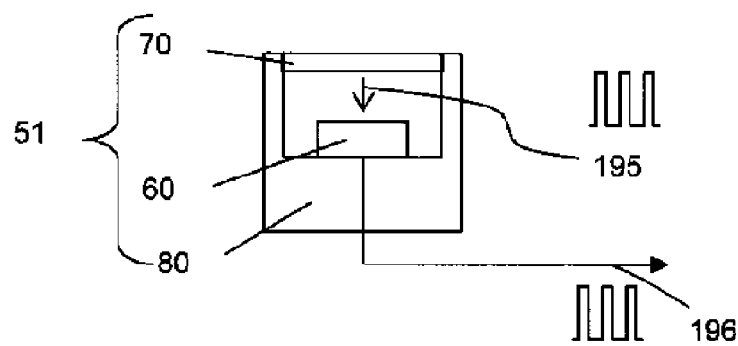

FIG. 5 is a view illustrating an example visible light communication system 100 of the present embodiment. FIG. 6 is a view illustrating a surface emission laser array element 102 used in the visible light communication system 100.

As illustrated in FIG. 5, a light transmitter 110 of the visible light communication system 100 includes a surface emission laser array element 102, a wavelength converter 30, and a package 40. The surface emission laser array element 102 includes a substrate and a plurality of surface emission lasers 103 provided on the substrate. The wavelength converter 30 is disposed to face a light output surface of the surface emission laser array element 102. The package 40 is configured to hold the surface emission laser array element 102 and the wavelength converter 30.

A light receiver 51 includes a light receiving element 60, an optical filter 70, and a package 80. The light receiving element 60 is configured to receive laser beams output from the surface emission lasers 103. The optical filter 70 is a sharp-cut filter provided above a light receiving surface of the light receiving element 60 and configured to transmit only light having a wavelength in a very narrow range, for example, a wavelength from 440 nm to 450 nm therethrough. The package 80 is configured to hold the light receiving element 60 and the optical filter 70. Each surface emission laser 103 is made of a group III nitride semiconductor and is configured to lase in the blue wavelength range from 440 nm to 450 nm by current injection.

The wavelength converter 30 is made of, for example, a transparent base material such as silicone or low-melting point glass containing a fluorescent material 31. The fluorescent material 31 is, for example, cesium-activated yttrium-aluminum-garnet (YAG:Ce), a mixture of europium-activated SiAlON (SiAlON:Eu) and europium-activated (Sr, Ca)AlSiN$_3$ crystals, or the like. The wavelength converter 30 absorbs part of the laser beams, which are in the blue wavelength range and have been emitted from the surface emission lasers 103, and outputs fluorescence having a wavelength from 490 nm to 660 nm in the green to red wavelength range.

Next, the surface emission laser array element 102 of the present embodiment will be described in detail with reference to FIGS. 6A and 6B. The surface emission laser array element 102 of the present embodiment includes the plurality of surface emission lasers 103. The surface emission lasers are so-called vertical cavity surface emitting lasers (VCSELs). The light output of each surface emission laser 103 is as small as about 1 mW. However, arranging the plurality of surface emission lasers in an array can produce light output higher than or as high as the light output from an LED without changing the chip size.

Figure 6A:
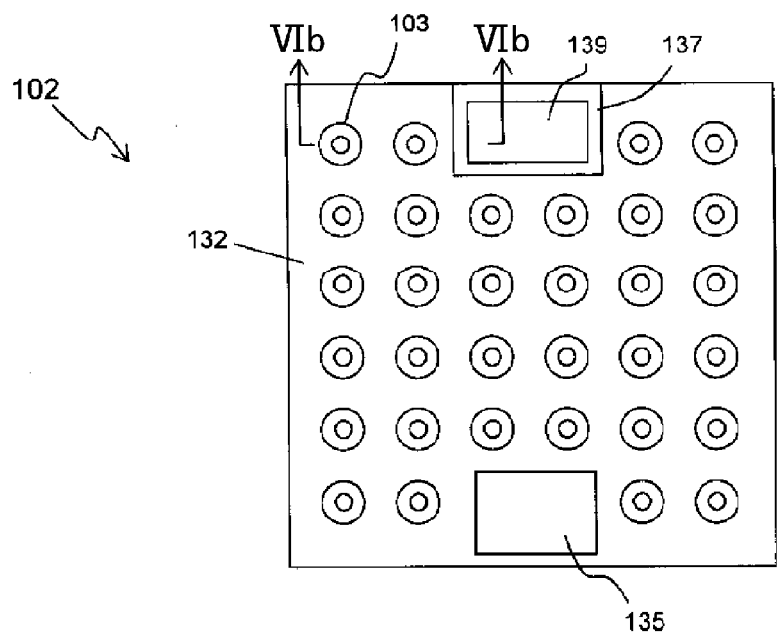
FIG. 6A is a top view illustrating a surface emission laser array element of the second embodiment of the present disclosure.

FIG. 6A is a top view illustrating the surface emission laser array element 102 of the present embodiment. As illustrated in FIG. 6A, the surface emission laser array element 102 includes the plurality of surface emission lasers 103 arranged in a matrix and a p-pad electrode 135. The p-pad electrode 135 is connected to a p-side contact layer of each surface emission laser 103 via a p contact electrode 132. An n-pad electrode 139 is provided in an opening 137 formed in the surface emission laser array element 102 and is electrically connected to an n-side contact layer of each surface emission laser 103.

Figure 6B:
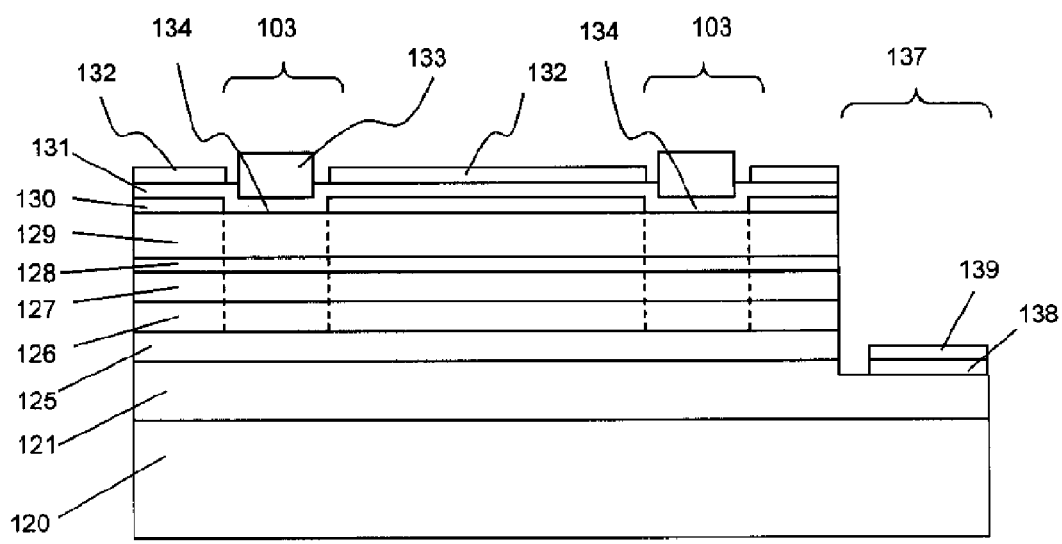
FIG. 6B is a cross-sectional view illustrating a part of the surface emission laser array element taken along the line VIb-VIb of FIG. 6A.

FIG. 6B is a cross-sectional view illustrating part of the surface emission laser array element 102 taken along the line VIb-VIb of FIG. 6A. Semiconductor layers included in the surface emission laser array element 102 are a first n-type nitride semiconductor layer 121, a first highly light-reflective layer 125, a second n-type nitride semiconductor layer 126, an active layer 127, a nitride semiconductor electron barrier layer 128, and a p-type nitride semiconductor layer 129 which are sequentially stacked on a substrate 120. The first n-type nitride semiconductor layer 121 is made of, for example, Si-doped GaN. The first highly light-reflective layer 125 is a distributed Bragg reflector (DBR) obtained by alternately stacking, for example, Si-doped AlGaN and Si-doped GaN. The second n-type nitride semiconductor layer 126 is made of, for example, Si-doped GaN. The active layer 127 is made of, for example, InGaN/GaN. The nitride semiconductor electron barrier layer 128 is made of, for example, Mg-doped AlGaN. The p-type nitride semiconductor layer 129 is, for example, a Mg-doped GaN layer. The substrate 120 is one of, for example, a sapphire substrate, a Si substrate, a SiC substrate, or GaN substrate. Here, the reflectance of the first highly light-reflective layer 125 is 99.9% at the emission wavelength of the surface emission laser 103.

An insulating layer 130 is formed on a surface of the p-type nitride semiconductor layer 129 of the surface emission laser array element 102. The insulating layer 130 is, for example, a SiO$_2$ film, and round openings 134 are formed in the insulating layer 130 in an array pattern. A transparent electrode 131 which is made of, for example, indium tin oxide is formed on the insulating layer 130. The p contact electrode 132 is provided on the transparent electrode 131 such that round openings formed in the p contact electrode 132 match the openings 134. A second highly light-reflective layer 133 which is a DBR film including, for example, alternately stacked SiO$_2$ and TiO$_2$ is provided above the round openings 134. Here, the reflectance of the second highly light-reflective layer 133 is 99.0% at the emission wavelength of the surface emission laser 103.

The opening 137 is formed to extend from the surface of the surface emission laser array element 102 to the first n-type nitride semiconductor layer 121 by dry etching, etc. In the opening 137, an n-contact electrode 138 which is made of, for example, Cr/Au is formed on the first n-type nitride semiconductor layer 121, and the n-pad electrode 139 which is made of, for example, Au is formed on the n-contact electrode 138.

In this configuration, a region located between the first highly light-reflective layer 125 and the second highly light-reflective layer 133 and directly under the opening 134 serves as a resonator of the surface emission laser 103. Here, as described above, the reflectance of the first highly light-reflective layer 125 is 99.9%, and the reflectance of the second highly light-reflective layer 133 is 99.0%. Both the first highly light-reflective layer 125 and the second highly light-reflective layer 133 are designed to have a very high reflectance exceeding 99% in order to lase.

Subsequently, the operation principle of the visible light communication system 100 of the present embodiment will be described. Operation of the visible light communication of the present embodiment is the same as that of the first embodiment, and thus the difference from the first embodiment will be mainly described below.

First, predetermined electric power is applied to a part of the surface emission laser array element 102 between the p-pad electrode 135 and the n-pad electrode 139, so that a current is injected into the surface emission lasers 103 via the p contact electrode 132. In each surface emission laser 103, electrons are injected into the active layer 127 via the n-contact electrode 138, the first n-type nitride semiconductor layer 121, the first highly light-reflective layer 125, and the second n-type nitride semiconductor layer 126. On the other hand, positive holes are injected into the active layer 127 from the p contact layer 132 via the transparent electrode 131 and the p-type nitride semiconductor layer 129.

The electrons and the positive holes injected into the active layer cause light-emitting recombination, and the resonator including the first highly light-reflective layer 125 and the second highly light-reflective layer 133 generates a laser beam. The generated laser beam is output from the second highly light-reflective layer 133 having low reflectance.

Here, in the opening 134 of the insulating layer 130, the transparent electrode 131 is in contact with the p-type nitride semiconductor layer 129, and the p-type nitride semiconductor layer 128 having high resistance can concentrate a current on the opening 134 in the insulating layer 130 without diffusing the current in lateral directions. Thus, a current can be injected intensively into a resonator region located directly under the opening 134, so that efficient lasing is possible.

The optical density of such a surface emission laser can be about two orders of magnitude higher than that of an LED. Thus, even when a plurality of surface emission lasers are arranged in an array pattern to obtain luminance as high as the luminance of the LED, the total area of the light-emitting unit can be reduced. Thus, the light output can be changed at a high speed compared to the LED.

The light transmitter 110 having the configuration described above outputs a transmission light signal 194 which is white light obtained by mixing transmission light signals 192 each of which is blue light output from the surface emission lasers 103 and fluorescence 193 output from the wavelength converter 30.

In the present embodiment, the surface emission lasers 103 are used as elements for converting a transmission electric signal 191 to the transmission light signal 194. Each surface emission laser is an element in which the diameter of a light-emitting unit is on the order of about several μm to several 10 μm, and the volume of an active layer is very small. Therefore, the surface emission laser has a short emission lifetime and can generate a transmission signal which modulates at a speed exceeding, for example, 1 Gbps. With this configuration, light communication at a super high speed can be achieved, which is difficult in the visible light communication system using a conventional white LED.

The divergence angel of emitted light of the surface emission laser is smaller than that of the LED. Therefore, the present system can be applicable to visible light communication using illumination such as a spotlight having high directivity.

Third Embodiment

Next, a visible light communication system of a third embodiment of the present disclosure will be described with reference to FIG. 7. FIG. 7 is a view illustrating a surface emission laser array element used also in the visible light communication system of the third embodiment. In the configuration of the surface emission laser array element illustrated in the third embodiment, some components are the same as those of the surface emission laser array element illustrated in the second embodiment. Therefore, the difference from the second embodiment will be mainly described below.

Figure 7A:
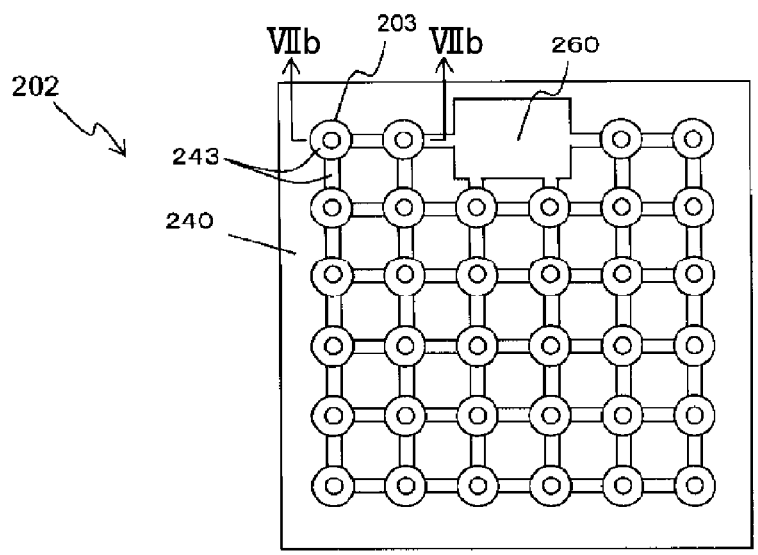
FIG. 7A is a top view of a surface emission laser array element of a third embodiment of the present disclosure.

FIG. 7A is a top view illustrating a surface emission laser array element 202 of the third embodiment. The surface emission laser array element 202 includes a plurality of surface emission lasers 203 arranged in a matrix. Each of n-contact electrodes 241 is provided to a corresponding one of the surface emission lasers 203 and is connected to an n-pad electrode 260 by an interconnect electrode 243.

Figure 7B:
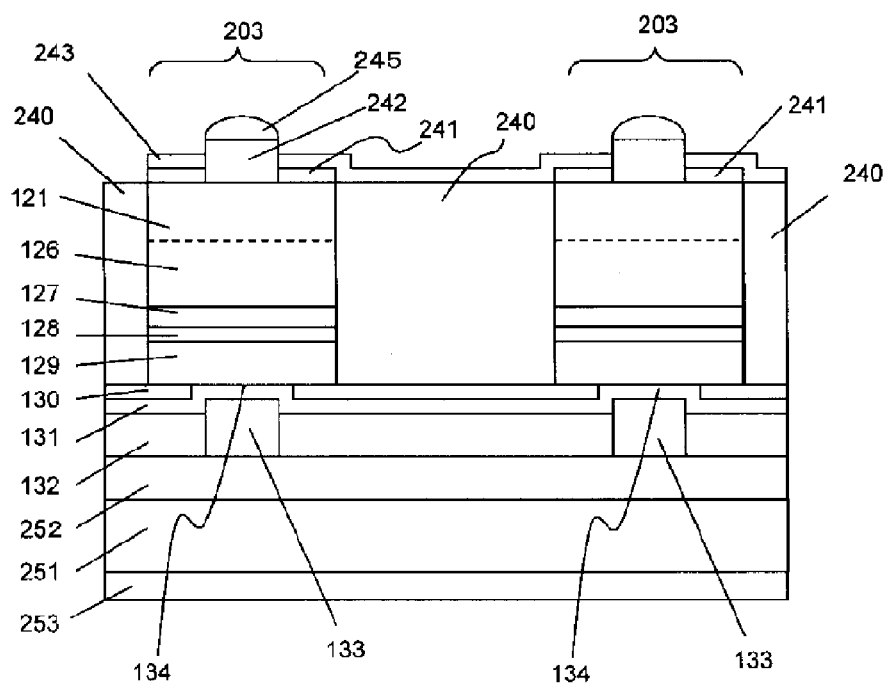
FIG. 7B is a cross-sectional view illustrating a part of the surface emission laser array element taken along the line VIIb-VIIb of FIG. 7A.

FIG. 7B is a cross-sectional view illustrating part of the surface emission laser array element taken along the line VIIb-VIIb of FIG. 7A.

The surface emission laser array element 202 includes a conductive support substrate 251 made of, for example, Si and a substrate-side electrode 253 made of, for example, Ti/Au. The substrate-side electrode 253 is provided on one surface of the conductive support substrate 251. On the other surface of the conductive support substrate 251, the surface emission lasers 203 made of a group III nitride semiconductor are provided via bonding metal 252 which is, for example, AuSn, a p-side contact electrode 132 formed by vapor deposition, plating, or the like, and a transparent electrode 131 made of, for example, indium tin oxide.

Each surface emission laser 203 includes a p-type nitride semiconductor layer 129 made of, for example, Mg-doped GaN, a p-type nitride semiconductor electron barrier layer 128 made of, for example, Mg-doped AlGaN, an active layer 127 made of an InGaN/GaN multiple quantum well, a second n-type nitride semiconductor layer 126 made of, for example, Si-doped GaN, and a first n-type nitride semiconductor layer 121 doped with, for example, Si. On a surface of the surface emission laser 203 which faces the substrate, a second highly light-reflective layer 133 which is, for example, a $TiO_2/SiO_2$ dielectric multilayer film (DBR) is provided via a transparent electrode 131. A first highly light-reflective layer 242 which is, for example, a $TiO_2/SiO_2$ dielectric multilayer film (DBR) is provided on the n-type nitride semiconductor layer 121.

In the configuration described above, a region between the first highly light-reflective layer 242 and the second highly light-reflective layer 133 serves as a resonator of the surface emission laser. Here, the reflectance of the first highly light-reflective layer 242 is 99%, and the reflectance of the second highly light-reflective layer 133 is 99.9%. Both the first highly light-reflective layer 242 and the second highly light-reflective layer 133 are designed to have a very high reflectance exceeding 99% to lase.

In order to efficiently inject a current into the resonator region of the surface emission laser 103, an insulating layer 130 made of, for example, $SiO_2$ is provided around a part of the transparent electrode 131 in which the second highly light-reflective layer 133 is provided. On the other hand, around the first highly light-reflective layer 242, an n-contact electrode 241 is provided in contact with the first n-type nitride semiconductor layer 121. Spaces between the surface emission lasers 203 are filled with an insulating layer 240 made of a resin, and an interconnect electrode 243 connecting the surface emission lasers are provided on the n-contact electrodes 241 and the insulating layer 240.

The surface emission laser array element 202 is fabricated by the following method including bonding elements formed on separated substrates.

First, in a manner similar to the first embodiment, the layers from the n-type nitride semiconductor layer 121 to the p-type nitride semiconductor layer 129 are sequentially formed on a substrate for crystal growth (not shown) such as a sapphire substrate, GaN substrate, or the like by a nitride semiconductor crystal growth technique, thereby preparing a nitride semiconductor growth substrate. Subsequently, the nitride semiconductor layers in regions in which the surface emission lasers are not formed are removed by semiconductor etching, or the like. The regions are filled with a low dielectric constant resin such as an acrylic resin or a low dielectric constant inorganic material such as $SiO_2$, thereby forming the insulating layer 240. Subsequently, the insulating layer 130 which is made of, for example, $SiO_2$ is formed, and openings 134 are formed by semiconductor lithography only in regions of the insulating layer 130 in which the surface emission lasers are to be formed.

On the insulating layer 130 in which the openings 134 have been formed, the transparent electrode 131 and the second high light reflection films 133 are formed. Then, the p contact electrode 132 which is a multilayer film including, for example, a Ti/Au film and an Au plating film is formed.

Next, a substrate is separately prepared which includes the conductive support substrate 251 which is, for example, a Si substrate, the substrate-side electrode 253 formed on one surface of the conductive support substrate 251, and the bonding metal 252 formed on the other surface of the conductive support substrate 251. The nitride semiconductor growth substrate and the conductive support substrate 251 are bonded to each other such that the p contact electrode 132 and the bonding metal 252 are electrically connected to each other. Then, the substrate for crystal growth is removed from the nitride semiconductor growth substrate by polishing.

Next, the n-contact electrode 241, the first highly light-reflective layer 242, and the interconnect electrode 243 are formed on the n-type nitride semiconductor layer 121 which has been exposed by removing the substrate for crystal growth. Finally, patterning, for example, a silicone resin is patterned to form light diffusing portions 245.

In the configuration described above, the surface emission lasers included in the surface emission laser array element are all connected to the n-pad electrode 260 by the interconnect electrode 243. Note that the interconnect electrode 243 is formed only in regions for connecting adjacent surface emission lasers, which is a feature of this configuration. The surface emission laser array element 202 of the present embodiment has the configuration described above, so that the area of the interconnect electrode 243 is reduced to reduce the parasitic capacitance. Thus, the surface emission laser array element 202 is suitable to the high-speed operation.

Another future is that the insulating layer 240 having a lower dielectric constant than the group III nitride semiconductor is provided under the interconnect electrode 243 between the surface emission lasers 203. Thus, the parasitic capacitance caused by the interconnect electrode 243 is reduced, so that the surface emission laser array element 202 is suitable to the high-speed operation.

In the surface emission laser array element 202 of the present embodiment, when a predetermined electric power is applied to a region between the n-pad electrode 260 and the substrate-side electrode 253, a current is injected into each surface emission laser 103 by the interconnect electrode 243. In each surface emission laser 103, electrons are injected into the active layer 127 from the interconnect electrode 243 via the n-contact electrode 241, the first n-type nitride semiconductor layer 121, and the second n-type nitride semiconductor layer 126. On the other hand, positive holes are injected into the active layer 127 from the substrate-side electrode 253 via the conductive support substrate 251, the bonding metal 252, the p contact electrode 132, the transparent electrode 131, and the p-type nitride semiconductor layer 129.

The electrons and the positive holes injected into the active layer cause light-emitting recombination, and a resonator including the first highly light-reflective layer 242 and the second highly light-reflective layer 133 lases. The generated laser beam is output from the first highly light-reflective layer 242 having low reflectance.

In each opening formed in the insulating layer 130, the transparent electrode 131 is in contact with the p-type nitride semiconductor layer 129, and the resistance of the p-type nitride semiconductor layer 129 is high. Therefore, the current is concentrated on the opening in the insulating layer 130 without being diffused to lateral directions. Thus, current injection concentrated on the resonator region vertically sandwiched between the first highly light-reflective layer 242 and the second highly light-reflective layer 133 is possible, so that efficient lasing is possible.

In particular, in the surface emission laser array element 202 of the third embodiment, the light diffusing portions 245 which are, for example, convex micro lenses are provided on the first highly light-reflective layer 242. With this configuration, the emission angle of light output from each surface emission laser 203 is increased by the light diffusing portion 245. Thus, a wavelength converter 30 is uniformly irradiated with light output from the surface emission laser array element 202. In this way, variations in spectrum which are caused depending on the output direction of light of the light transmitter can be reduced. As a result, location dependency of communication sensitivity of the light receiver in the visible light communication system is reduced, so that preferable optical communication can be achieved.

That is, visible light communication using general illumination becomes possible, and since surface emission lasers are used as light sources, a higher speed communication than LED can be achieved.

In the present embodiment, in order to increase the emission angle of light output from the surface emission laser 203, the light diffusing portion 245 is provided on the first highly light-reflective layer 242. However, the light diffusing portion 245 is not essential. On the surface of the wavelength converter 30, a light diffusing portion such as a convex lens may be provided, or a light diffusing portion such as a convex lens may be disposed separately from the wavelength converter. Also in this case, similar effects can be obtained.

The shape of the light diffusing portion 245 may be but not limited to the convex lens. For example, a concave lens may be used, or a diffusion structure having an uneven surface may be used.

Fourth Embodiment

Next, a visible light communication system of a fourth embodiment of the present disclosure will be described with reference to FIG. 8.

Figure 8A:
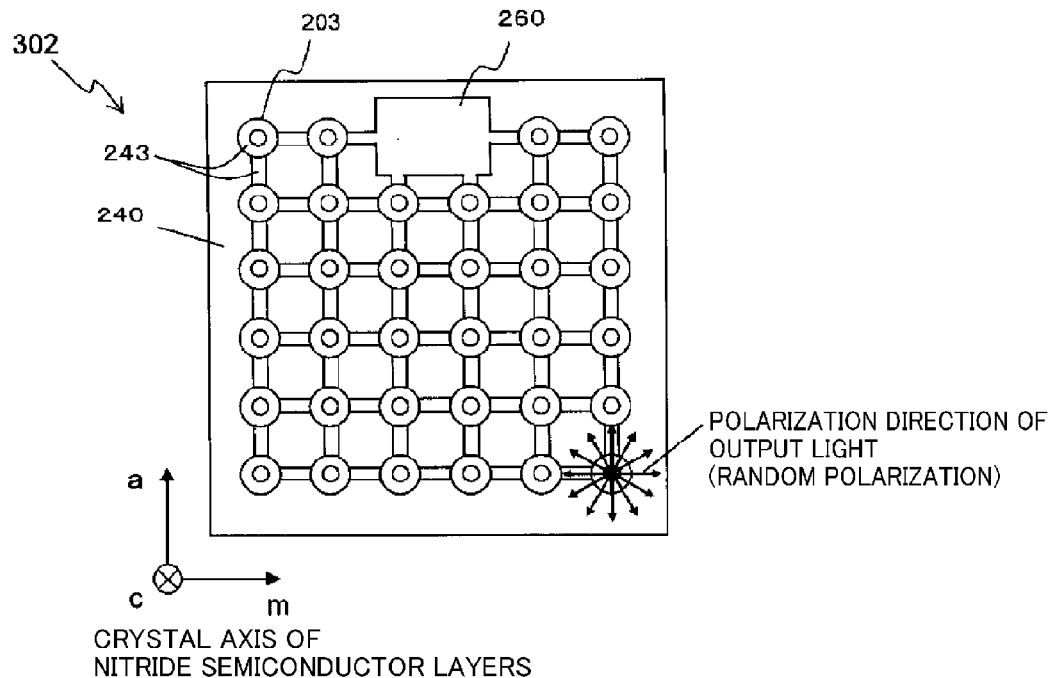
FIG. 8A is a view illustrating a polarization state of a surface emission laser on a c-plane GaN substrate of a fourth embodiment of the present disclosure.
Figure 8B:
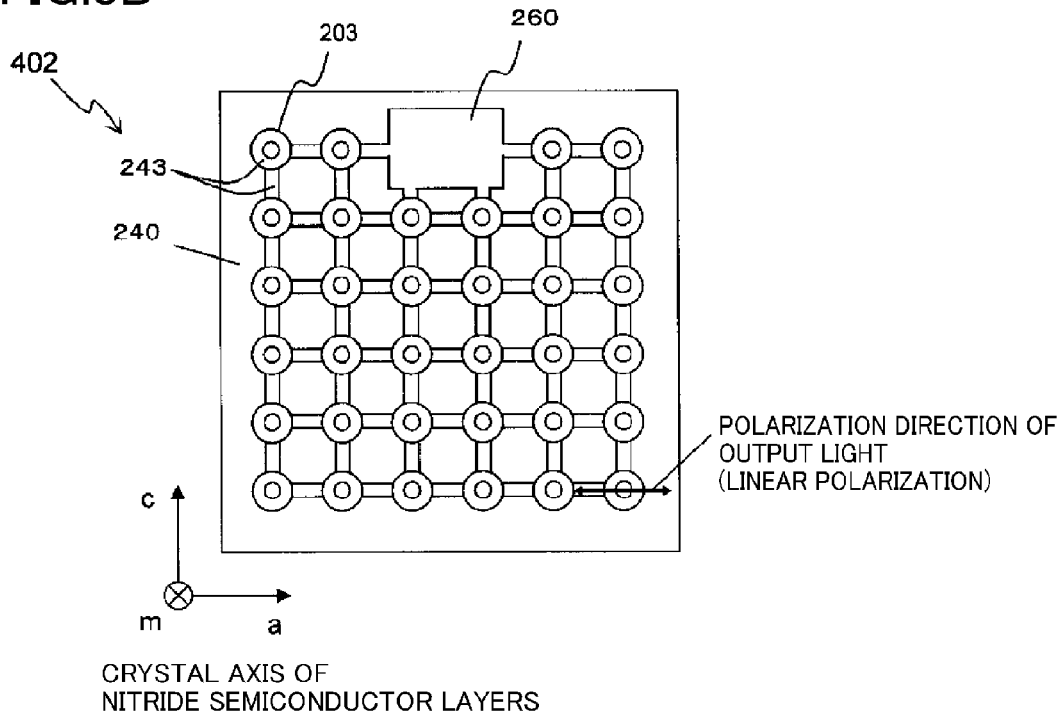
FIG. 8B is a view illustrating a polarization state of a surface emission laser on an m-plane GaN substrate of the fourth embodiment of the present disclosure.

FIGS. 8A and 8B are respectively top views of surface emission laser array elements 302 and 402 also used in the visible light communication system of the present embodiment. More specifically, FIG. 8A is a view illustrating the surface emission laser array element 302 fabricated by using a c-plane GaN substrate whose crystal growth surface is the c-plane as a substrate for crystal growth, the direction of a crystal axis of nitride semiconductor layers of the surface emission laser array element 302, and the polarization direction of light output from the surface emission laser array element 302. In this case, the direction of crystal growth of the nitride semiconductor layers including an active layer is the c-axis direction. FIG. 8B is a view illustrating the surface emission laser array element 402 fabricated by using an m-plane GaN substrate whose crystal growth surface is the m-plane, the direction of a crystal axis of nitride semiconductor layers of the surface emission laser array element 402, and the polarization direction of light output from the surface emission laser array element 402. In this case, the direction of crystal growth of the nitride semiconductor layers including an active layer is the m-axis direction.

Here, the configurations of the surfaces and cross sections of the surface emission laser array elements 302 and 402 are the same as those shown in FIGS. 7A and 7B.

At the present time, the c-plane GaN substrate whose crystal growth surface is the c-plane is used as a substrate for crystal growth of a semiconductor laser element containing a group III nitride semiconductor. However, when the crystal axis of a stacking direction of nitride semiconductor layers is the c-axis, the crystal structure of the nitride semiconductor layers has a symmetry axis in the plane of the active layer. Thus, the polarization state of light output from each surface emission laser is a random polarization state in which light is polarized in various polarization directions as indicated by arrows on the surface emission laser at the lower right of FIG. 8A. That is, the polarized light is not defined in one direction, and thus polarization switching is caused in which the polarization direction changes according to variations in operating condition such as an environmental temperature. The polarization switching causes light output variations in time and is thus a cause of noise in the case of high-speed optical communication.

In contrast, as illustrated in FIG. 8B, in a configuration in which the crystal axis in the stacking direction of, for example, the nitride semiconductor layers is the m-axis, the directions of the crystal axes in the plane of the nitride semiconductor layer are the c-axis direction and the a-axis direction. In particular, in a nitride semiconductor such as gallium nitride crystals, gallium atoms and nitrogen atoms are unevenly distributed, and the dipole moment of the atoms is in a direction parallel to the c-axis direction. Thus, anisotropy arises in the gain of the active layer. As a result, lasing in which light of a laser is linearly polarized in a direction perpendicular to the c-axis direction as illustrated at the lower right of FIG. 8B is obtained. That is, when an m-plane GaN substrate is used as a substrate for crystal growth of the nitride semiconductor as in the case of the present embodiment, light linearly polarized in one direction is obtained due to the asymmetry of crystals. As a result, stability of the polarized light to the variation in operating condition is improved, so that preferable optical communication in which noise is less likely to be generated can be achieved.

With this configuration, the stacking direction of the nitride semiconductor layers included in the surface emission lasers of the surface emission laser array element is inclined from the c-axis to preferably coincide with the m-axis, so that noise such as an output change caused by polarization switching is reduced. Thus, light which has a narrow wavelength spectral width and is further stabilized in the blue wavelength range can be output from the light transmitter. As a result, noise in a high-speed received signal generated in the light receiver of the visible light communication system can be further reduced. Thus, preferable optical communication less influenced by light from outside can be achieved by using the visible light communication system of the present embodiment.

In the present embodiment, while the case where the substrate for crystal growth whose crystal growth surface is the m-plane has been described, the present embodiment is not limited to this configuration. For example, using a so-called semi-polar substrate in which the crystal axis inclined from the c-axis is in the [11-22] plane, [1-101] plane, [2021] plane, or the like, or a non-polar substrate in which the crystal axis is in the a-plane provides similar effects.

Fifth Embodiment

Next, a visible light communication system of a fifth embodiment of the present disclosure will be described with reference to FIGS. 9A and 9B.

Figure 9A:
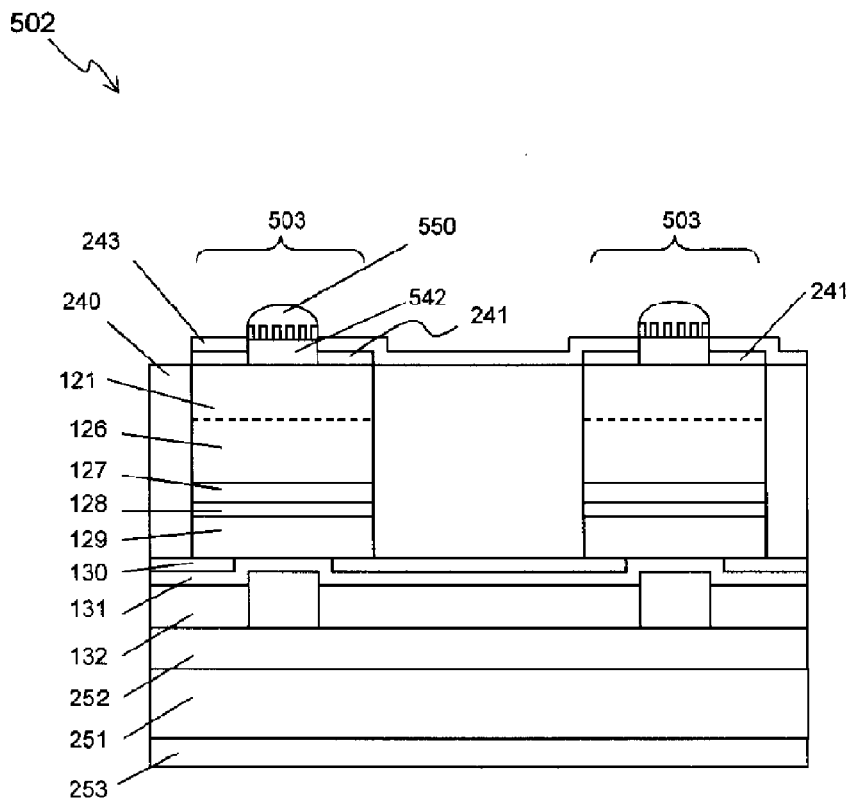
FIG. 9A is a cross-sectional view of a surface emission laser array element of a fifth embodiment of the present disclosure.
Figure 9B:
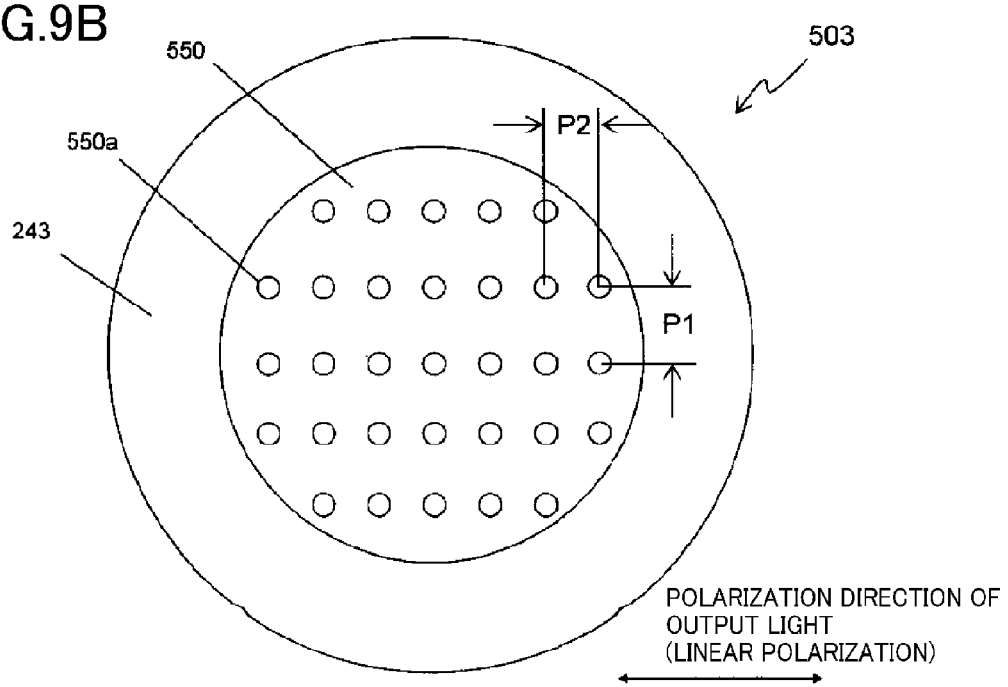
FIG. 9B is an enlarged view illustrating an upper surface of a second highly light-reflective layer of FIG. 9A.

FIGS. 9A and 9B show a surface emission laser array element 502 also used in the visible light communication system of the present embodiment. FIG. 9A is a cross-sectional view schematically illustrating a part of the surface emission laser array element 502. FIG. 9B is a top view illustrating a part of a surface emission laser 503 of the surface emission laser array element 502.

In the surface emission laser array element 502 of the present embodiment, as illustrated in FIG. 9A, rectangular lattice metal hole arrays 550 are formed on a second highly light-reflective layer 542. The other parts are similar to those of the surface emission laser array element of the third embodiment.

The second highly light-reflective layer 542 is, for example, a dielectric film made of $SiO_2$, or the like. As illustrated in FIG. 9B, each rectangular lattice metal hole array 550 includes a metal thin film made of, for example, Ag or Al, wherein micro openings 550a are formed in the metal thin film to form a rectangular lattice. The periods between the micro openings 550a are different between two directions orthogonal to each other. Period P1 in one direction is set such that the surface plasmon resonance is caused and the light transmittance is high, and Period P2 in the direction orthogonal to the one direction is set such that no surface plasmon resonance is caused and the light transmittance is low.

With this configuration, anisotropy arises in the light transmittance of the metal thin film, the polarization is controlled to be in the polarization direction in which transmittance optimal for oscillation of the surface emission laser. For example, the polarization direction of output light can be the horizontal direction as illustrated in FIG. 9B.

With this configuration, noise caused by polarization switching of the surface emission laser array element 502 is reduced. As a result, noise in a received signal generated by a light receiver of the visible light communication system can be reduced. Thus, light which has a narrow wavelength spectral width, has further stabilized light output, and is in the blue wavelength range can be output from the light transmitter. Therefore, preferable optical communication can be achieved by using the visible light communication system of the present embodiment even when superimposition of light from outside on the background reduces the amplitude of the reception light signal in the light receiver.

The visible light communication system of the present disclosure allows super high speed optical communication using visible light used for illumination. The visible light communication system of the present disclosure is applicable not only to light transmitting/receiving systems using general illumination, a spotlight used in houses or offices, but also to light transmitting/receiving systems using illumination of vehicle illumination apparatuses or illumination of traffic networks such as signal apparatuses and lighting apparatuses on roads.

What is claimed is:

1. A visible light communication system comprising:
   a light transmitter including:
      a group III nitride semiconductor laser element and
      a wavelength converter disposed to face a light exit surface of the group III nitride semiconductor laser element and containing a fluorescent material;
   a wavelength filter configured to remove light emitted from the fluorescent material; and
   a light receiving element configured to receive light emitted from the group III nitride semiconductor laser element via the wavelength filter,
   wherein the wavelength filter does not contact the light receiving element.

2. The visible light communication system of claim 1, wherein
   the group III nitride semiconductor laser element is a surface emission laser array element including a plurality of group III nitride semiconductor surface emission lasers.

3. The visible light communication system of claim 2, wherein
   a stacking direction of nitride semiconductor multilayer films included in each group III nitride semiconductor surface emission laser is a direction of a crystal axis inclined from a c-axis.

4. The visible light communication system of claim 3, wherein
   the crystal axis is an m-axis.

5. The visible light communication system of claim 2, wherein
   each group III nitride semiconductor surface emission laser has a light outgoing section provided with a metal thin film in which micro openings are formed and arranged in a rectangular lattice.

6. The visible light communication system of claim 2, wherein
   each group III nitride semiconductor surface emission laser has a light outgoing section provided with a light diffusing element.

7. The visible light communication system of claim 6, wherein
   the light diffusing element is a convex lens.

8. The visible light communication system of claim 2, wherein
   a resin layer having a lower dielectric constant than a group III nitride semiconductor is formed between the group III nitride semiconductor surface emission lasers.

9. The visible light communication system of claim 1 further comprising:
   a package configured to hold the wavelength filter and the light receiving element, wherein
   the wavelength filter is provided to an opening, of the package, for passage of the light emitted from the group III nitride semiconductor laser element.

10. The visible light communication system of claim 1, wherein the light emitted from the group III nitride semiconductor laser element has a peak wavelength ranging from 440 nm to 450 nm.

11. The visible light communication system of claim 1, wherein the fluorescent material is cesium-activated yttrium-aluminum-garnet (YAG:Ce), or a mixture of europium-activated SiAlON (SiAlON:Eu) and europium-activated (Sr, Ca)AlSiN$_3$ crystals.

12. A visible light communication system comprising:
a light transmitter including:
- a group III nitride semiconductor laser element and
- a wavelength converter disposed to face a light exit surface of the group III nitride semiconductor laser element and containing a fluorescent material;
a wavelength filter configured to remove light emitted from the fluorescent material; and
a light receiving element configured to receive light emitted from the group III nitride semiconductor laser element via the wavelength filter, wherein
the light emitted from the group III nitride semiconductor laser element has a peak wavelength ranging from 440 nm to 450 nm, and
the fluorescent material is cesium-activated yttrium-aluminum-garnet (YAG:Ce), or a mixture of europium-activated SiAlON (SiAlON:Eu) and europium-activated (Sr, Ca)AlSiN$_3$ crystals.

* * * * *